(12) United States Patent
Nakamura et al.

(10) Patent No.: US 10,910,235 B2
(45) Date of Patent: Feb. 2, 2021

(54) SUBSTRATE TREATING APPARATUS AND SUBSTRATE TREATING METHOD

(71) Applicant: SCREEN Holdings Co., Ltd., Kyoto (JP)

(72) Inventors: Kazuki Nakamura, Kyoto (JP); Katsunori Tanaka, Kyoto (JP); Masahiro Nonomura, Kyoto (JP)

(73) Assignee: SCREEN Holdings Co., Ltd.

( * ) Notice: Subject to any disclaimer, the term of this patent is extended or adjusted under 35 U.S.C. 154(b) by 73 days.

(21) Appl. No.: 15/962,416

(22) Filed: Apr. 25, 2018

(65) Prior Publication Data

US 2018/0315624 A1 Nov. 1, 2018

(30) Foreign Application Priority Data

Apr. 27, 2017 (JP) ................................. 2017-088214

(51) Int. Cl.
*H01L 21/67* (2006.01)
*H01L 21/687* (2006.01)

(52) U.S. Cl.
CPC .... *H01L 21/67051* (2013.01); *H01L 21/6708* (2013.01); *H01L 21/67028* (2013.01); *H01L 21/67034* (2013.01); *H01L 21/68728* (2013.01); *H01L 21/68792* (2013.01)

(58) Field of Classification Search
CPC combination set(s) only.
See application file for complete search history.

(56) References Cited

U.S. PATENT DOCUMENTS

| 5,950,675 | A | 9/1999 | Minami et al. ............... 137/606 |
| 10,133,173 | B2 | 11/2018 | Miyagi et al. |
| 2006/0234503 | A1 | 10/2006 | Yamada et al. ............... 438/667 |
| 2010/0200547 | A1 | 8/2010 | Higashijima et al. .......... 216/92 |
| 2016/0064259 | A1 | 3/2016 | Kurusu et al. |
| 2016/0204006 | A1 | 7/2016 | Fujii |

(Continued)

FOREIGN PATENT DOCUMENTS

| JP | 08-064490 A | 3/1996 |
| JP | 2007-046838 A | 2/2007 |

(Continued)

OTHER PUBLICATIONS

Office Action dated Oct. 8, 2019 in corresponding Korean Patent Application 10-2018-0049225.

(Continued)

*Primary Examiner* — Erin F Bergner
(74) *Attorney, Agent, or Firm* — Ostrolenk Faber LLP

(57) ABSTRACT

A control device is provided which, at a time of upper surface treatment for treating an upper surface of a substrate with a treating device, supplies a treating liquid from a treating liquid supply source and operates a first control valve to supply a gas at a first flow rate from a gas nozzle, while operating a rotary drive device to spin the substrate at a first rotational frequency, and at a time of drying treatment, after completion of the upper surface treatment, for drying the substrate by increasing the rotational frequency of the rotary drive device to spin the substrate at a second rotational frequency, operates the first control valve and second control valve to supply the gas at a higher flow rate than the first flow rate from the gas nozzle.

6 Claims, 9 Drawing Sheets

(56) References Cited

U.S. PATENT DOCUMENTS

| | | |
|---|---|---|
| 2016/0214148 A1 | 7/2016 | Okutani et al. |
| 2016/0236239 A1 | 8/2016 | Nishiyama |
| 2016/0372340 A1 | 12/2016 | Takeaki et al. |

FOREIGN PATENT DOCUMENTS

| | | |
|---|---|---|
| JP | 5156661 B2 | 3/2013 |
| JP | 2016-48775 A | 4/2016 |
| JP | 2016-072609 A | 5/2016 |
| JP | 2017-063130 A | 3/2017 |
| KR | 10-1998-0067879 A | 10/1998 |
| KR | 10-2016-0043000 A | 4/2016 |
| KR | 10-2016-0091281 A | 8/2016 |
| KR | 10-2016-0100839 A | 8/2016 |
| KR | 10-2016-0150031 A | 12/2016 |
| TW | 200507979 A | 3/2005 |
| TW | 201419397 A | 5/2014 |
| TW | 201624558 A | 7/2016 |
| WO | WO 2015/025889 A1 | 2/2015 |
| WO | WO-2015025889 A1 * | 2/2015 |

OTHER PUBLICATIONS

Notice of Allowance dated Jan. 17, 2020 for corresponding Korean Patent Application No. 10-2018-0049225.
Office Action dated Mar. 25, 2020 for corresponding Taiwan Patent Application No. 107113970.
Office Action and Search Report dated Aug. 25, 2020 for corresponding Japanese Patent Application No. 2017-088214.

* cited by examiner

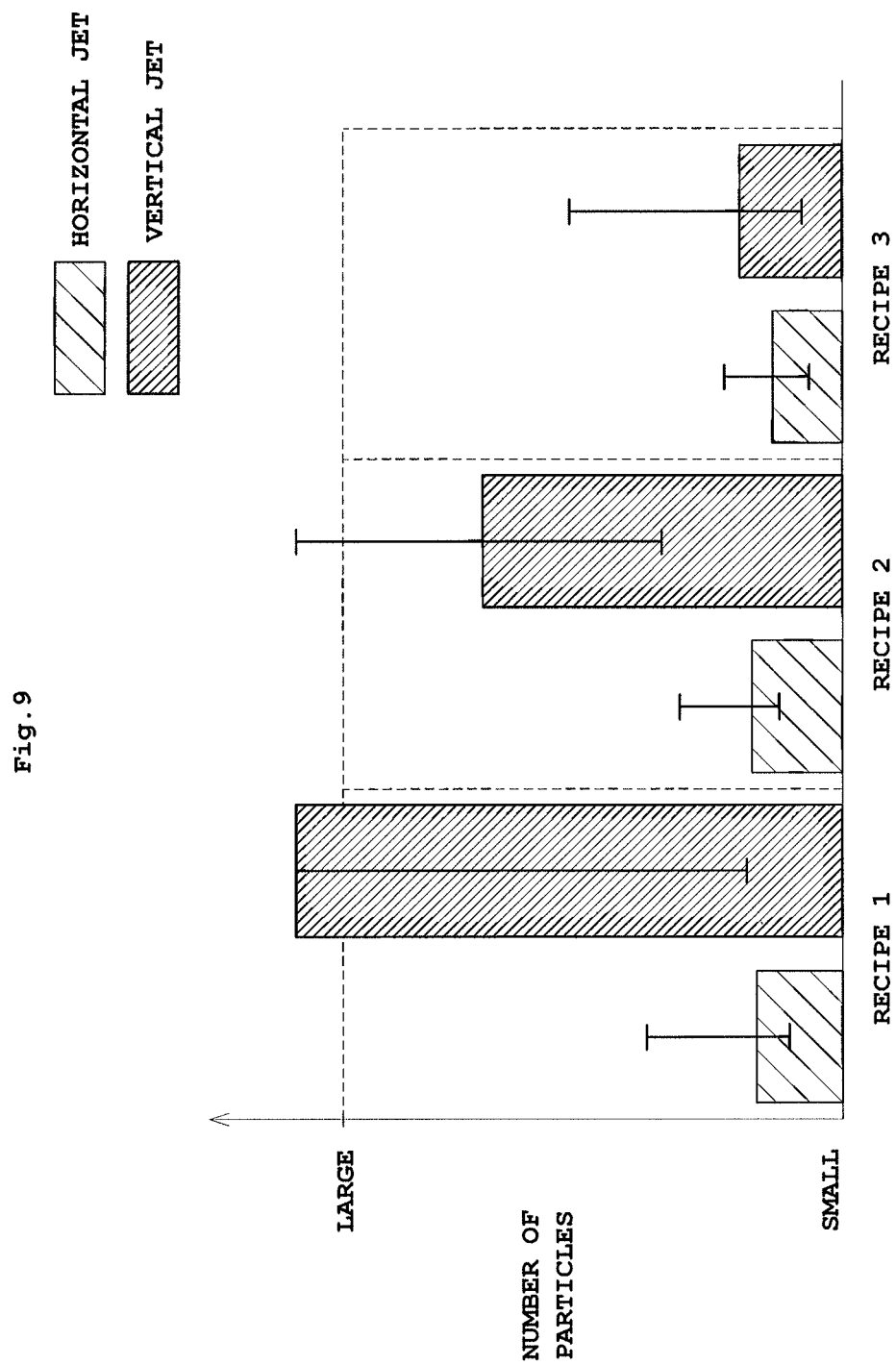

SUBSTRATE TREATING APPARATUS AND SUBSTRATE TREATING METHOD

BACKGROUND OF THE INVENTION

(1) Field of the Invention

This invention relates to a technique for treating semiconductor wafers, substrates for liquid crystal displays, substrates for plasma displays, substrates for organic ELs, substrates for FEDs (Field Emission Displays), substrates for optical displays, substrates for magnetic disks, substrates for magneto-optical disks, substrates for photomasks and substrates for solar cells (hereinafter called simply the substrates), and more particularly to a technique for drying lower surfaces of the substrates by supplying gas to the lower surfaces covered with a treating liquid after treating upper surfaces of the substrates.

(2) Description of the Related Art

Conventionally, this type of apparatus includes a spin chuck for holding each substrate in a horizontal position, a spin mechanism for spinning the spin chuck, a treating liquid supply mechanism for supplying a treating liquid to the lower surface of the substrate from a treating liquid nozzle disposed in a spin center region of the spin chuck, a gas supply mechanism for supplying a drying gas to the lower surface of the substrate from a gas nozzle disposed in the spin center region of the spin chuck, and a cleaning mechanism for cleaning the upper surface of the substrate (see Japanese patent No. 5156661, for example).

In such an apparatus, the spin chuck is spun by the spin mechanism, and the upper surface of the substrate is cleaned by the cleaning mechanism while the lower surface of the substrate is protected by the treating liquid supplied from the treating liquid nozzle to the lower surface of the substrate. When the cleaning by the cleaning mechanism is completed, the treating liquid from the treating liquid supply mechanism is stopped, and the lower surface of the substrate wet with the treating liquid is dried by supplying the drying gas from the gas nozzle. The treating liquid adhering to the gas nozzle at the time of cleaning treatment can be blown up to the lower surface of the substrate at the time of drying treatment to lower the degree of cleanliness of the lower surface of the substrate. In practice, therefore, the drying gas is supplied at a low flow rate from the gas nozzle also at the time of cleaning treatment of the substrate. On the other hand, it is desired to increase the flow rate of the drying gas for shortening the time consumed in drying treatment, and some apparatus have a construction for supplying the drying gas at a high flow rate, which is achieved by switching the flow rate of the drying gas between the cleaning time and the drying time with a mass flow controller of the gas supply mechanism.

However, the conventional example with such a construction has the following problems.

In the conventional apparatus, the mass flow controller is so slow in response to switching of the flow rate of the drying gas as to cause a delay of a few seconds (1 to 2 seconds) in switching the drying gas to a higher flow rate. Thus, there is a problem of making it difficult to shorten the time of drying treatment. Further, the spinning of the substrate causes negative pressure adjacent the center, and the delay occurring with the flow rate switching of the drying gas will result in a problem that the delay occurring at the time of flow rate switching of the drying gas results in ambient particles getting drawn in toward the center of the substrate during the drying treatment, thereby to lower the degree cleanliness of the lower surface of the substrate.

It is conceivable to set the flow rate of the drying gas at the time of cleaning treatment to the higher flow rate at the time of drying treatment. However, this could disturb the surface of the treating liquid covering the lower surface of the substrate at the time of cleaning treatment, thereby rendering protection of the lower surface of the substrate insufficient, or scattering the treating liquid to adversely affect the upper surface of the substrate. It is therefore unrealistic to raise the flow rate at the time of drying treatment. There would also be a problem of increasing consumption of the drying gas, and hence an increase in waste.

SUMMARY OF THE INVENTION

This invention has been made having regard to the state of the art noted above, and its object is to provide a substrate treating apparatus and a substrate treating method which can improve response to switching of gas flow rate, thereby to realize a shortening of drying time and treatment of the lower surfaces of substrates with a high degree of cleanliness.

To fulfill the above object, this invention provides the following construction.

A substrate treating apparatus, according to this invention, for treating an upper surface of a substrate in a state where a lower surface of the substrate is covered with a treating liquid, the apparatus comprising a turntable spinnable about a vertical axis; a rotary drive device for spinning the turntable; a support device erected on the turntable for contacting edge regions of the substrate to support the lower surface of the substrate as spaced from an upper surface of the turntable; a treating device for acting on and treating the upper surface of the substrate supported by the support device; a treating liquid supply device for supplying the treating liquid to the lower surface of the substrate; a gas nozzle for supplying a gas from a center of the turntable to the lower surface of the substrate; a gas supply pipe with one end thereof connected to the gas nozzle; a gas supply device for supply the gas; first branch piping with one end thereof connected to the gas supply device, and the other end connected to the other end of the gas supply pipe; second branch piping with one end thereof connected to the gas supply device, and the other end connected to the other end of the gas supply pipe; a first control valve for controlling circulation of the gas through the first branch piping to a first flow rate; a second control valve for controlling circulation of the gas through the second branch piping to a second flow rate higher than the first flow rate; and a control device configured, at a time of upper surface treatment for treating the upper surface of the substrate with the treating device, to supply the treating liquid from the treating liquid supply device and operate the first control valve to supply the gas at the first flow rate from the gas nozzle, while operating the rotary drive device to spin the substrate at a first rotational frequency, and at a time of drying treatment, after completion of the upper surface treatment, for drying the substrate by increasing the rotational frequency of the rotary drive device to spin the substrate at a second rotational frequency, to operate the first control valve and the second control valve to supply the gas at a higher flow rate than the first flow rate from the gas nozzle.

According to this invention, the control device, at the time of upper surface treatment with the treating device, causes the treating liquid to be supplied from the treating liquid supply device while operating the rotary drive device to spin the substrate at the first rotational frequency, and operates the first control valve to supply the gas at the first flow rate from the gas nozzle to the lower surface of the substrate. Then, after completion of the upper surface treatment, at the time of drying treatment for drying the substrate at the second rotational frequency to which the rotational frequency of the rotary drive device is increased, the control device operates the first control valve and second control valve to supply the gas at a higher flow rate than the first flow rate from the gas nozzle. At the time of drying treatment, the control device only operates the first control valve and second control valve, which can improve response of flow rate switching of the gas. Consequently, drying time can be shortened, and treatment can be done with a high degree of cleanliness of the lower surface of the substrate.

In this invention, it is preferred that the first control valve and the second control valve are adjustable to desired flow rates.

Since the flow rates of the control valve and the second control valve can to set to desired flow rates, it is possible to set flow rates appropriate to the upper surface treatment and the drying treatment.

In this invention, it is preferred that the control device is configured to keep the first control valve constantly open.

Since the gas is constantly supplied from the gas nozzle, the treating liquid from the treating liquid supply device can be prevented from stagnating in the gas supply pipe at the time of upper surface treatment. It is therefore possible to prevent the lower surface of the substrate from being contaminated by droplets blown upward from the gas nozzle at the time of drying treatment.

In this invention, it is preferred that the control device is configured, when operating the first control valve and the second control valve, to open the second control valve while keeping the first control valve open.

Since the second control valve is opened while the first control valve is kept open, there will occur no interruption of the gas supplied from the gas nozzle. This prevents detention of the treating liquid in the gas supply pipe and adhesion thereto of droplets, and detention of particles in the space between the lower surface of the substrate and the turntable, whereby treatment can be performed with a high degree of cleanliness on the lower surface of the substrate.

In this invention, it is preferred that the control device is configured to supply the gas at least at the second flow rate during a period from a point of time of starting to increase rotational frequency from the first rotational frequency to the second rotational frequency to a point of time of reaching the second rotational frequency.

The degree of cleanliness on the lower surface of the substrate is adversely affected, depending on the timing of gas flow from the gas nozzle at the time of switching the rotational frequency from the upper surface treatment to the drying treatment. That is, when the timing is too early, the gas flow will be disturbed, and when the timing is too late, ambient particles will be drawn to the central region. So, such an inconvenience can be prevented by switching to the flow rate at least equal to the second flow rate during the period from the point of time of starting to increase rotational frequency from the first rotational frequency to the second rotational frequency to the point of time of reaching the second rotational frequency.

In this invention, it is preferred that the gas nozzle is configured to supply the gas radially toward the edge regions of the substrate in plan view.

Since gas flows can be produced evenly and radially from the center toward the edge regions of the substrate, the treatment with the gas can be carried out uniformly.

In this invention, it is preferred that the gas nozzle has an opening height of at least 2 mm for supplying the gas.

When the opening height of the gas nozzle is too small, the gas flow velocity will become too fast, which will produce particles to lower the degree cleanliness. So, by setting the opening height of the gas nozzle to 2 mm or more, an appropriate flow velocity can be realized to prevent lowering of the cleanliness without producing particles.

In another aspect of this invention, there is provided a substrate treating method for treating an upper surface of a substrate in a state where a lower surface of the substrate is covered with a treating liquid, the method comprising the following steps executed in order: an upper surface treating step for treating the upper surface of the substrate by spinning a turntable at a first rotational frequency, with the turntable contacting and supporting edge regions of the substrate to have the lower surface of the substrate spaced from the turntable, and operating a first control valve to supply a gas at a first flow rate from a gas nozzle located centrally of the turntable to the lower surface of the substrate; and a drying step for spinning the turntable at a second rotational frequency higher than the first rotational frequency, and operating the first control valve and the second control valve to supply the gas at a higher flow rate than the first flow rate from the gas nozzle.

According to this invention, at the time of upper surface treatment, the substrate is spun at the first rotational frequency, and in the state of the lower surface of the substrate covered with the treating liquid, the first control valve is operated to supply the gas at the first flow rate from the gas nozzle to the lower surface of the substrate. Then, at the time of drying treatment, the substrate is spun at the second rotational frequency, and the first control valve and second control valve are operated to supply the gas at a higher flow rate than the first flow rate from the gas nozzle. At the time of drying treatment, only the first control valve and second control valve are operated, which can improve response of flow rate switching of the gas. Consequently, drying time can be shortened, and treatment can be done with a high degree of cleanliness of the lower surface of the substrate.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 9 is an explanatory graph of a relationship between direction of gas supply from a gas-liquid nozzle and degree of cleanliness.

DESCRIPTION OF THE PREFERRED EMBODIMENTS

One embodiment of this invention will be described hereinafter with reference to the drawings.

Figure 1:
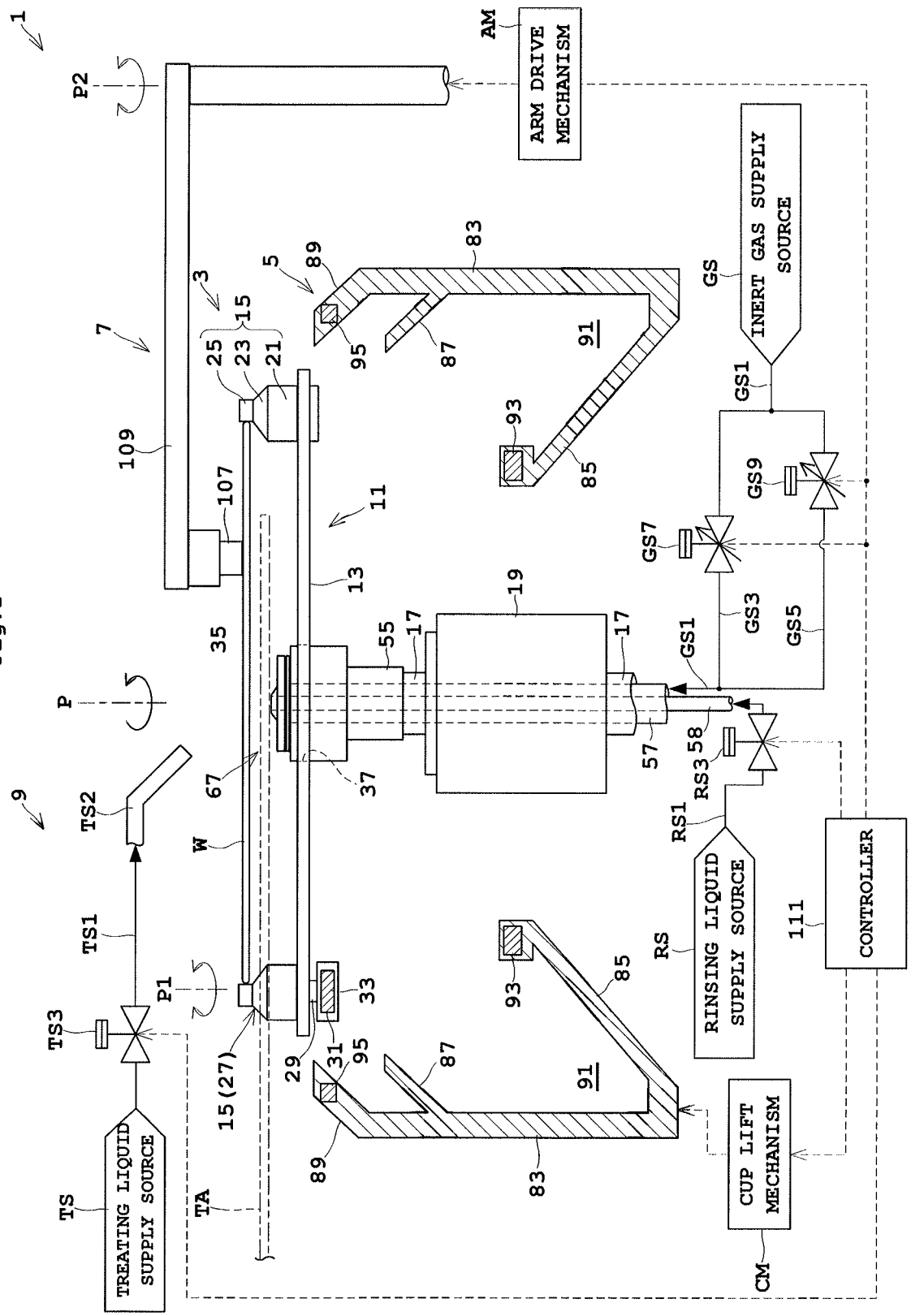
FIG. 1 is a view in vertical section showing an outline construction of a substrate treating apparatus according to an embodiment.
Figure 2:
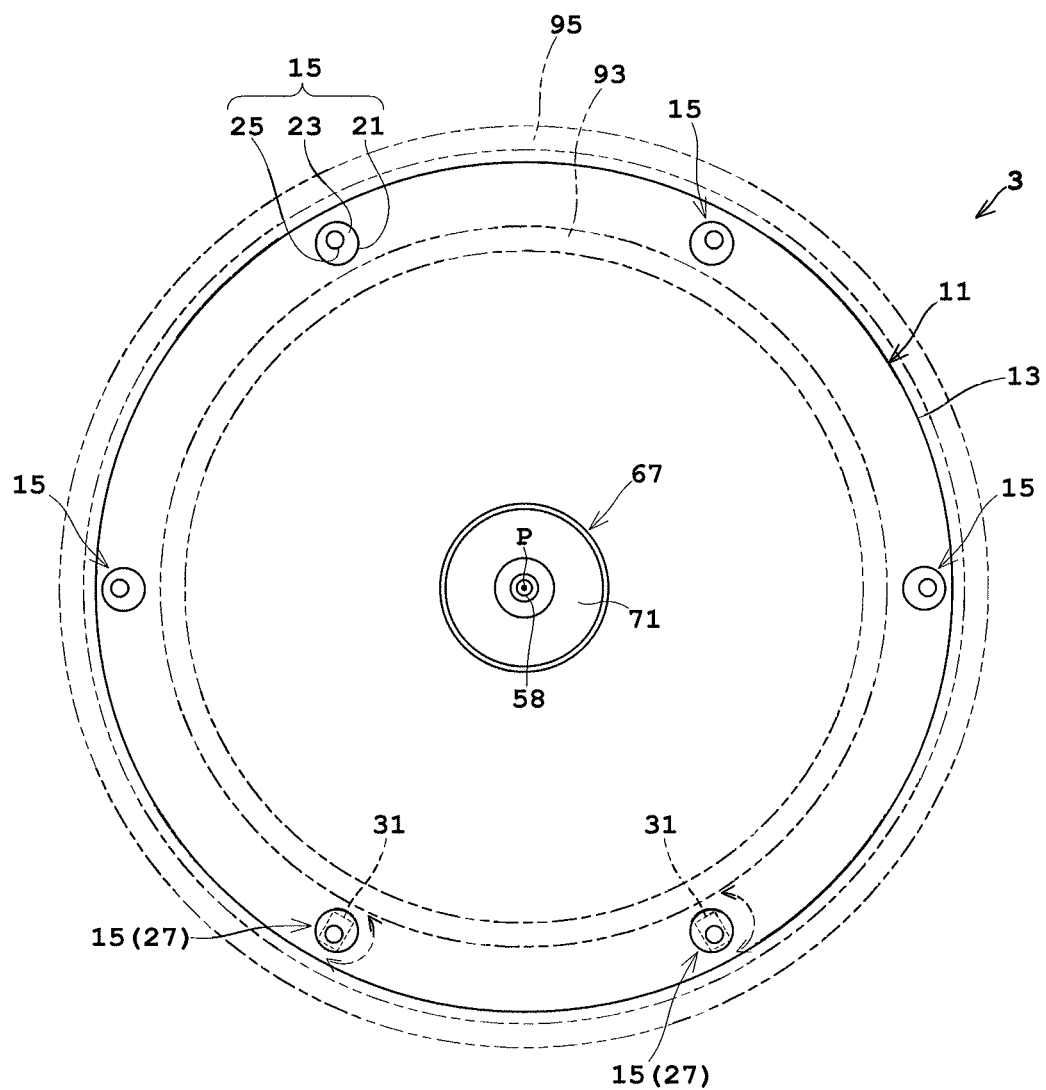
FIG. 2 is a plan view of a spin chuck.
Figure 3:
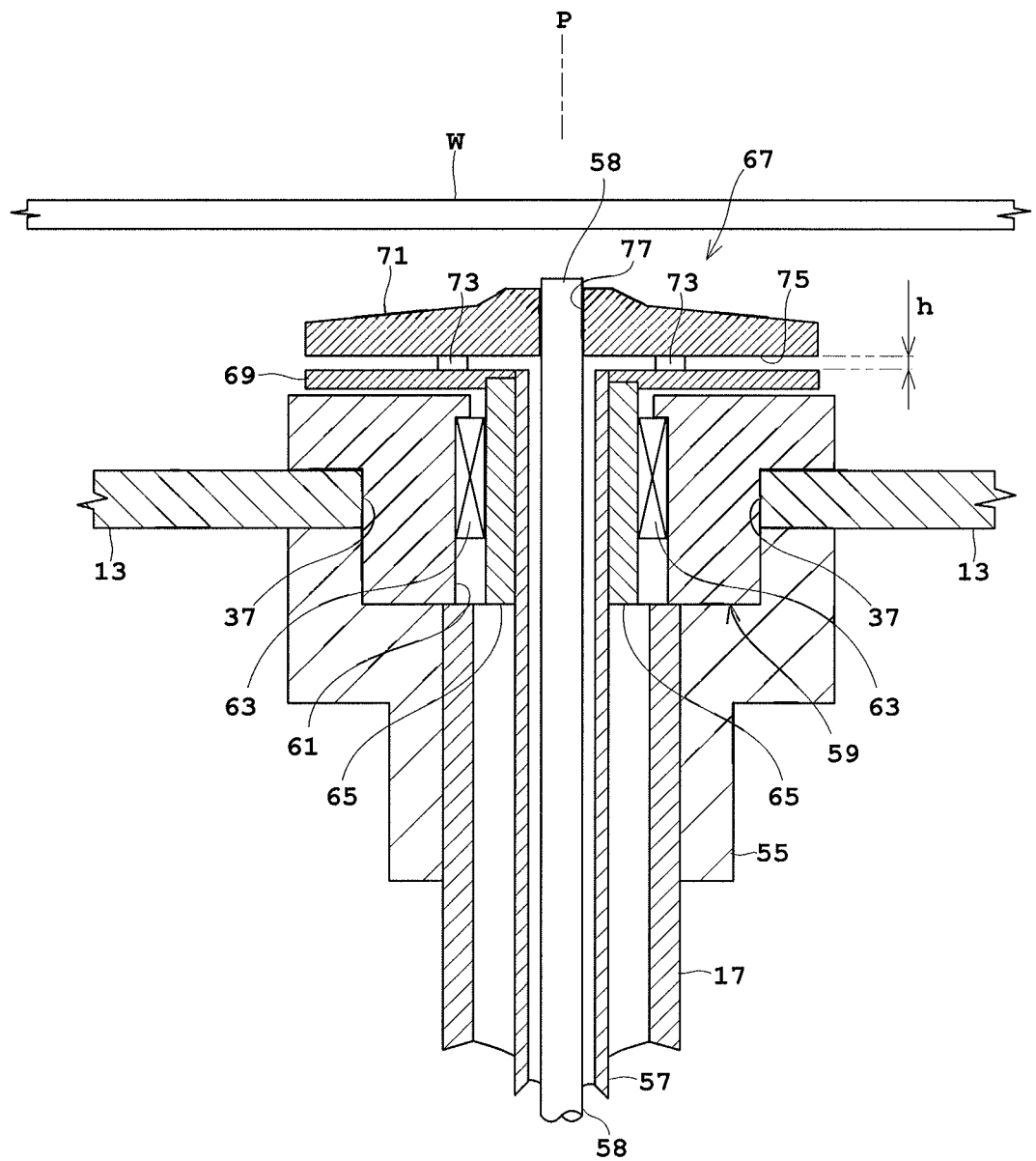
FIG. 3 is a view in vertical section showing a construction including a gas nozzle and adjacent components.

FIG. 1 is a view in vertical section showing an outline construction of a substrate treating apparatus according to the embodiment. FIG. 2 is a plan view of a spin chuck. FIG. 3 is a view in vertical section showing a construction including a gas nozzle and adjacent components.

The substrate treating apparatus according to the embodiment performs cleaning treatment of wafers W. This substrate treating apparatus 1 includes a support and spin mechanism 3, a scatter preventive cup 5, a treating mechanism 7, and a treating liquid supply mechanism 9.

The support and spin mechanism 3 supports each wafer W in a horizontal position and spins the wafer W about a spin axis P extending in a vertical direction. The spin chuck 11 includes a spin base 13 having a larger diameter than the wafer W, and six support pins 15 erected in peripheral regions of the spin base 13. The spin base 13 has one end of a rotary shaft 17 connected to a lower portion thereof. The other end of the rotary shaft 17 is connected to an electric motor 19. The rotary shaft 17 is constructed rotatable by the electric motor 19 about the vertical spin axis P.

Each support pin 15 has a shank portion 21, a slope portion 23, and a contact portion 25. The shank portion 21 has a cylindrical outward appearance. The slope portion 23 is formed of an upper part of the shank portion 21 to present a conical outward appearance having a large sloping area opposed to the spin center of the spin base 13, with the contact portion 25 formed on an upper end thereof. The contact portion 25 is formed in a position deviating outward from the center of the support pin 15 in plan view. Two adjoining support pins 15 among the six support pins 15 are movable support pins 27 each constructed rotatable about a rotation axis P1 extending in the vertical direction. The six support pins 15, by contacting edges of the wafer W, support the wafer W to have the lower surface thereof spaced from the upper surface of the spin base 13. The spin base 13 has a central opening 37 formed centrally thereof in plan view.

Each movable support pin 27 has a rotary shaft 29 penetrating the spin base 13. The rotary shaft 29 has a magnet holder 31 formed at a bottom end thereof. This magnet holder 31 has a pin-driving permanent magnet 33 embedded therein. This pin-driving permanent magnet 33 is rotatable clockwise or counterclockwise about the vertical axis P1 by magnetism of a releasing permanent magnet 95 or a cup-side permanent magnet 93 described hereinafter.

The above spin base 13 corresponds to the "turntable" in this invention. The electric motor 19 corresponds to the "rotary drive device" in this invention. The above six support pins 15 correspond to the "support device" in this invention.

The rotary shaft 17 has an upper part thereof connected to a boss 55 of the spin base 13. The boss 55 is connected to the lower surface of the spin base 13 to cover the central opening 37 from below. The rotary shaft 17 is hollow and has a gas supply pipe 57 mounted in its interior. This gas supply pipe 57 has a rinsing liquid supply pipe 58 mounted in its interior. The rinsing liquid supply pipe 58 has a tip end thereof projecting upward from a tip end of the gas supply pipe 57. The gas supply pipe 57 and rinsing liquid supply pipe 58 are not in contact with an inner peripheral surface of the rotary shaft 17, but maintain a stationary state. A tip holder 59 is mounted in an upper part of the boss 55 and in the central opening 37. The tip holder 59 has an opening 61 formed centrally thereof and a holding tube 65 is mounted in the opening 61 through a bearing 63. A tip end region of the gas supply pipe 57 is engaged in an inner peripheral wall of this holding tube 65. The holding tube 65 and gas supply pipe 57 are held to have tip ends thereof slightly projecting from an upper surface of the tip holder 59. This tip holder 59 permits rotation about the vertical axis of the rotary shaft 17 and spin base 13, while maintaining mutual height positions of the rotating rotary shaft 17, spin base 13, and so on and the non-rotating gas supply pipe 57 and rinsing liquid supply pipe 58, A gas-liquid nozzle 67 is mounted on an upper part of the tip holder 59 for supplying an inert gas between the lower surface of the wafer W and the upper surface of the spin base 13. This gas-liquid nozzle 67 is connected to be in communication with one end, that is an upper end, of the gas supply pipe 57, and includes a base portion 69, a baffle member 71, and legs 73. The base portion 69 has an upper end of the holding tube 65 connected to a central region of a lower surface thereof. The gas supply pipe 57 has the upper end thereof open to the upper surface of the base portion 69. A plurality of legs 73 are erected on the upper surface of the base portion 69 in positions outward of the center. The legs 73 have their respective upper ends connected to a lower surface of the baffle member 71. The lower surface of the baffle member 71 and the upper surface of the base portion 69 are spaced from each other by the legs 73, thereby to form a blowout opening 75. The baffle member 71 with the lower surface thereof directs sideways the gas supplied from the gas supply pipe 57, and jets the gas out through the blowout opening 75 from a central area under the wafer W toward peripheral areas of the wafer W. This blowout opening 75 feeds the gas radially outward from the center in plan view. The blowout opening 75 has a height h set to 2 mm, for example.

When the opening height h of the gas-liquid nozzle 67 is too low, the flow velocity of the gas will become too fast, which will produce particles to lower the degree of cleanliness. So, an appropriate flow velocity is obtained by setting the opening height h of the gas-liquid nozzle 67 to 2 mm as in this embodiment, thereby to prevent the lowering of cleanliness with no particles produced. The opening height h preferably is in a range of 2 mm to 5 mm.

The above gas-liquid nozzle 67 corresponds to the "gas nozzle" in this invention.

An opening 77 is formed centrally of the baffle member 71. This opening 77 receives the tip end of the rinsing liquid supply pipe 58 inserted therein. The rinsing liquid supply pipe 58 is disposed and fixed to have the tip end thereof slightly projecting from the upper surface of the baffle member 71. The rinsing liquid supply pipe 58 supplies a rinsing liquid toward a central region of the lower surface of the wafer W.

The gas supply pipe 57 has the other end in the direction of lower end, to which one end of supply piping GS1 is connected. The other end of the supply piping GS1 is connected to an inert gas supply source GS. The inert gas supply source GS supplies nitrogen gas ($N_2$ gas) as inert gas, for example. The supply piping GS1 branches into first branch piping GS3 and second branch piping GS5. In other words, one end of each of the first branch pipe GS3 and second branch piping GS5 is connected to the inert gas supply source GS, and the other end is connected to the other end of the gas supply pipe 57. The first branch piping GS3 has a control valve GS7, while the second branch piping GS5 has a control valve GS9. The control valves GS7 and GS9 are capable of adjusting flow rate, and permit and block circulation of the gas. The control valves GS7 and GS9 are adjustable to a desired value of flow rate, and after the flow rate is set to a desired value beforehand, they can be switched by control from outside between a state of blocking circulation of the gas and a state of permitting circulation at the flow rate having the desired value.

In this embodiment, the control valve GS7 is set to a first flow rate, and the control valve GS9 to a second flow rate. Here, the second flow rate is equal to or higher than the first flow rate. When, for example, the first flow rate is 5 liter/min, the second flow rate may be 5 liter/min. or higher. In other words, the first flow rate and the second flow rate may be the same. In this embodiment, the second flow rate is 30 liter/min., for example.

The above inert gas supply source GS corresponds to the "gas supply device" in this invention. The control valve GS7 corresponds to the "first control valve" in this invention. The control valve GS9 corresponds to the "second control valve" in this invention.

The rinsing liquid supply pipe 58 has a lower end to which one end of supply piping RS1 is connected. The other end of the supply piping RS1 is connected to a rinsing liquid supply source RS. The supply piping RS1 has a switch valve RS3. The supply piping RS1, when the switch valve RS3 is opened, will supply the rinsing liquid to the rinsing liquid supply pipe 58 at a predetermined flow rate. The rinsing liquid supply source RS supplies deionized water as the rinsing liquid, for example.

The above rinsing liquid supply pipe 58, rinsing liquid supply source RS, supply piping RS1, and switch valve RS3 correspond to the "treating liquid supply device" in this invention.

The scatter preventive cup 5 is disposed to surround the support and spin mechanism 3 and to be vertically movable by a cup lift mechanism CM. The cup lift mechanism CM moves the scatter preventive cup 5 vertically between a lower position for loading and unloading of the wafer W, and an upper position for treatment of the wafer W. This scatter preventive cup 5 prevents scattering to the ambient of the treating liquids from the wafer W supported by the spin chuck 11.

Specifically, the scatter preventive cup 5 includes a cylindrical portion 83, a lower guide portion 85, an upper guide portion 87, and an upper edge portion 89. A space delimited by the upper guide portion 87 and lower guide portion 85 forms a drain portion 91 for collecting the treating liquids having scattered around at the time of treatment of the wafer W. The lower guide portion 85 has the cup-side permanent magnet 93 embedded in a distal end of an inner periphery thereof. This cup-side permanent magnet 93 is ring-shaped in plan view, which is formed coaxial to the spin axis P. The cup-side permanent magnet 93 is located in a position radially closer to the center than the pin-driving permanent magnets 33 described hereinbefore. The cup-side permanent magnet 93 is embedded to have the magnetic poles effective in horizontal directions. The cup-side permanent magnet 93, when close to the pin-driving permanent magnets 33 of the movable support pins 27, will impart its magnetic force to rotate the movable support pins 27 counterclockwise in plan view, drive the pins 27 to a holding position and maintain the pins 27 in this state.

The upper edge portion 89 has the releasing permanent magnet 95 embedded therein. This releasing permanent magnet 95 is ring-shaped in plan view, which is formed coaxial to the spin axis P. The releasing permanent magnet 95 is located in a position radially outward of the pin-driving permanent magnets 33. The releasing permanent magnet 95 is embedded to have the magnetic poles effective in horizontal directions. The releasing permanent magnet 95 has the magnetic pole opposed to the spin axis P which is rendered homopolar with the radially outward magnetic pole of the cup-side permanent magnet 93. The releasing permanent magnet 95, when close to the pin-driving permanent magnets 33, will impart its magnetic force to rotate the movable support pins 27 clockwise in plan view, drive the pins 27 to open positions and maintain the pins 27 in this state.

The treating mechanism 7 is attached to the scatter preventive cup 5. The treating mechanism 7 in this embodiment includes a brush 107, a swing arm 109, and an arm drive mechanism AM. The brush 107 scrubs the upper surface of the wafer W clean by acting on the upper surface of the wafer W through the treating liquid described hereinafter. The swing arm 109 has the brush 107 attached to one end thereof, and is constructed swingable about a rotation axis P2 at the other end. The arm drive mechanism AM drives the swing arm 109 to swing about the rotation axis P2.

The above brush 107 corresponds to the "treating device" in this invention.

The treating liquid supply mechanism 9 includes a treating liquid supply source TS, treating liquid piping TS1, a treating liquid nozzle TS2, and a switch valve TS3. The treating liquid supply source TS supplies APM (ammonia and hydrogen peroxide water mixed solution) as treating liquid, for example. The treating liquid piping TS1 has one end thereof connected to the treating liquid supply source TS, and the other end connected to the treating liquid nozzle TS2. The treating liquid nozzle TS2 has a tip end thereof directed toward the rotation center of the wafer W, and when the switch valve TS3 is opened, supplies the APM adjacent the center of the wafer W.

The various components described above are operable under overall control by a controller 111. The controller 111 includes a CPU, memory, and so on not shown. The controller 111 operates the cup lift mechanism CM to move the scatter preventive cup 5 up and down, and operates the electric motor 19 to adjust rotational frequency of the wafer W. The controller 111 also executes opening and closing of the control valves GS7 and GS9, and switch valves RS3 and TS3 to control circulation and flow rate of the nitrogen gas and circulation of the deionized water and APM. Further, the controller 111 operates the arm drive mechanism AM to control swinging of the brush 107. While the controller 111 controls each component according to a recipe specifying a sequence of treatment of the wafer W, its characteristic function is to control the flow rate of the nitrogen gas at this time as described hereinafter.

The above controller 111 corresponds to the "control device" in this invention.

Figure 4:
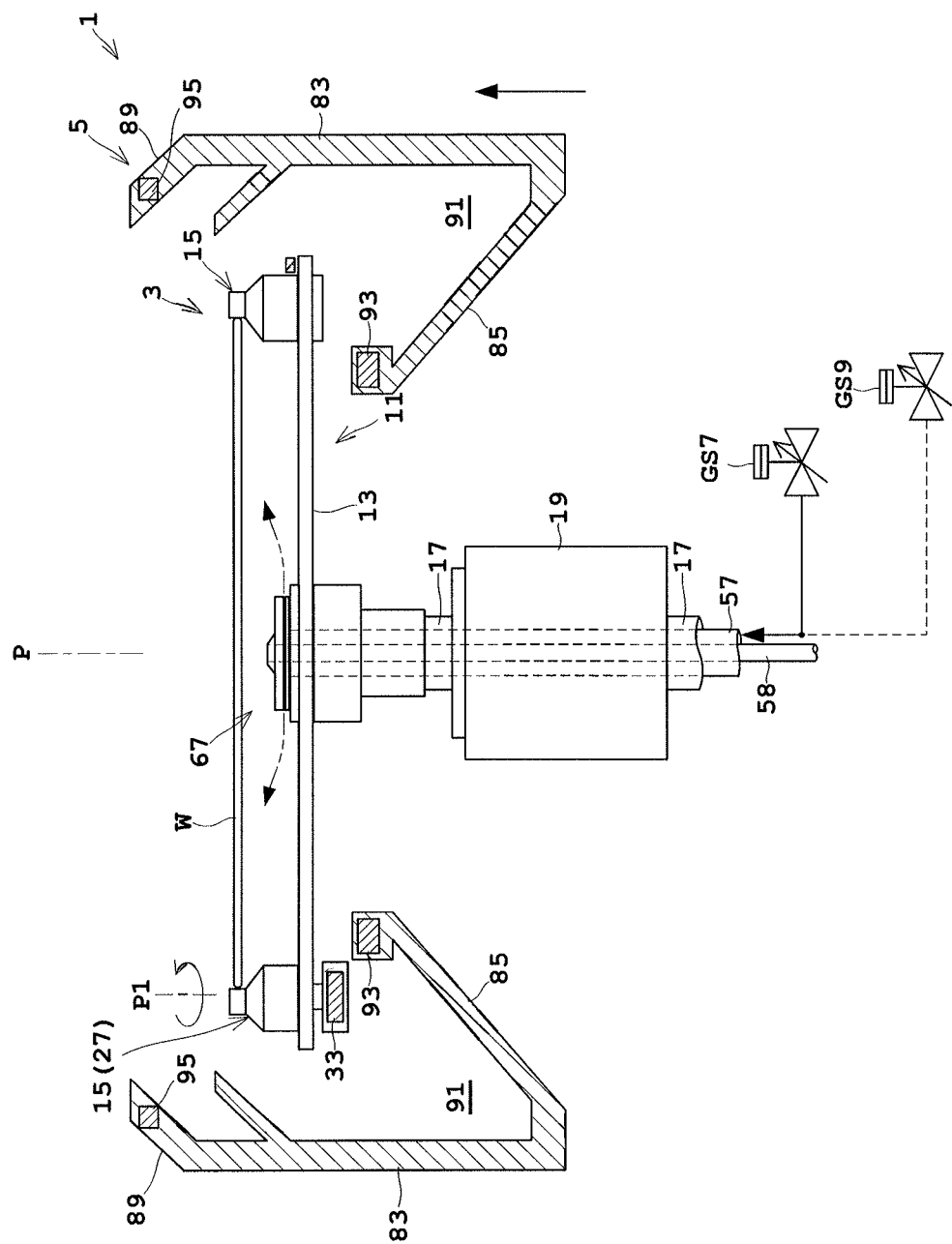
FIG. 4 is an explanatory view of operation at a time of loading of a substrate.
Figure 5:
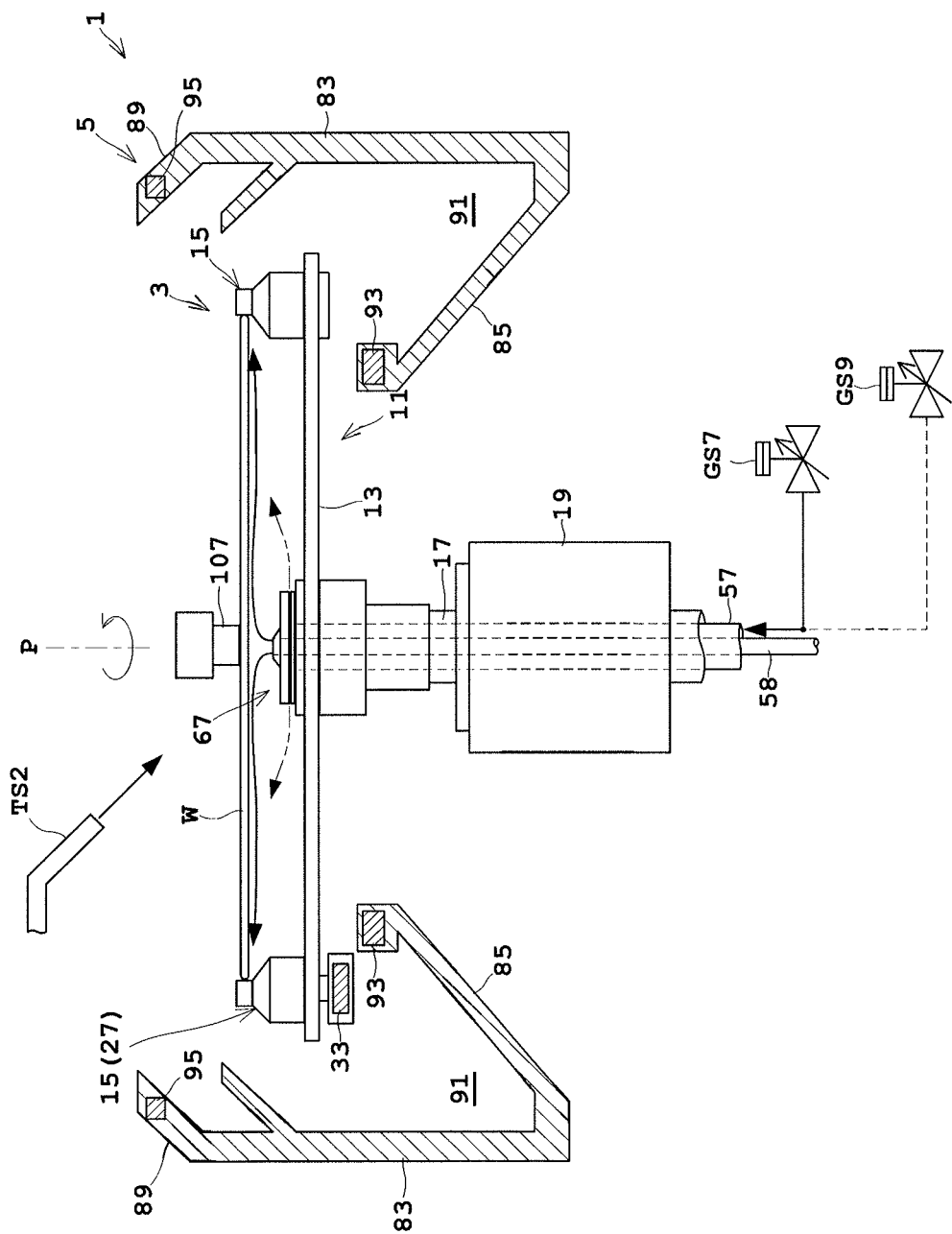
FIG. 5 is an explanatory view of operation at a time of cleaning treatment of the substrate.
Figure 6:
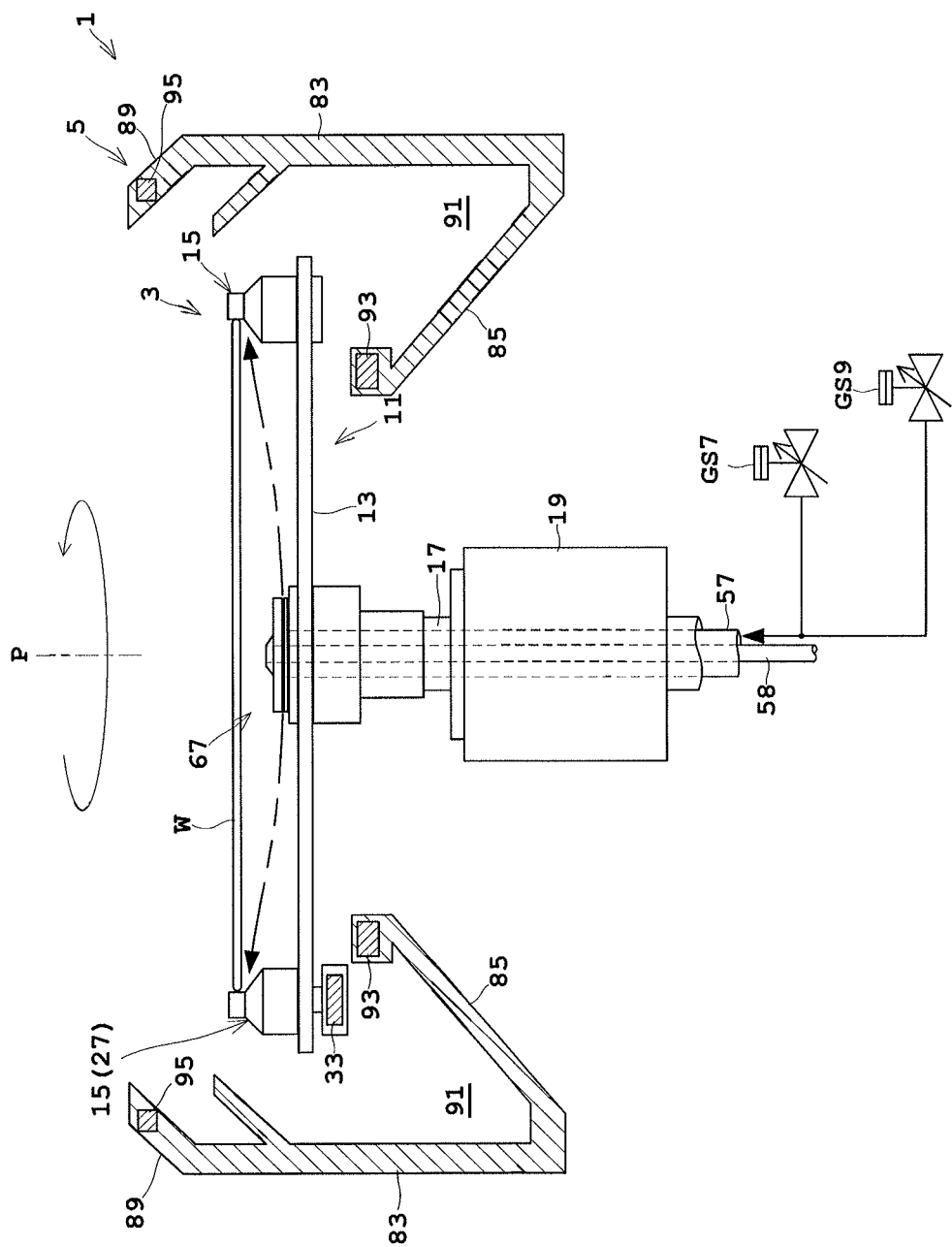
FIG. 6 is an explanatory view of operation at a time of drying treatment of the substrate.

Description will now be made of the flow rate control by the controller 111 of the nitrogen gas supplied to the lower surface of the wafer W. FIG. 4 is an explanatory view of operation at a time of loading of a substrate. FIG. 5 is an explanatory view of operation at a time of cleaning treatment of the substrate. FIG. 6 is an explanatory view of operation at a time of drying treatment of the substrate.

Assume that the spin chuck 11 has already received and is supporting a wafer W to be treated. That is, as shown in FIG. 1, a wafer W is received from a transport arm TA in a state of the scatter preventive cup 5 having been lowered to the lower position. At this time, the movable support pins 27 are placed in the open positions by the releasing permanent magnet 95, and so the wafer W is only loosely supported by the six support pins 15. And, when the scatter preventive cup 5 is raised to the upper position as shown in FIG. 4, the movable support pins 27 are moved to the holding positions by the cup-side permanent magnet 93. Consequently, the wafer W is pressed by the two movable support pins 27 toward the spin axis P, whereupon the wafer W is clamped at edges thereof by the six support pins 15. The controller 111 constantly maintains the control valve GS7 open to allow the inert gas to be supplied at a first flow rate (minimal flow rate) from the gas-liquid nozzle 67 to the lower surface of the wafer W.

Next, as shown in FIG. 5, the controller 111 rotates the electric motor 19 to spin the wafer W. Then, the controller 111 opens the switch valves TS3 and RS3 to supply the APM to the upper surface of the wafer W and supply deionized water as back rinsing liquid to the lower surface of the wafer W. Further, the controller 111 operates the arm drive mechanism AM to swing the brush 107 between the central region and edge region of the wafer W.

After completion of the above cleaning treatment with the brush 107, and rinsing treatment for rinsing away the APM by supplying the rinsing liquid from a rinsing liquid nozzle, not shown, to the upper surface of the wafer W, the controller 111 spin-dries the wafer W by increasing the rotational frequency of the electric motor 19. At the time of this drying treatment, as shown in FIG. 6, the controller 111 opens the control valve GS9 while keeping the control valve GS7 open. Consequently, the inert gas is supplied from the gas-liquid nozzle 67 to the lower surface of the wafer W at a higher flow rate than the first flow rate, which results from addition of a second flow rate to the first flow rate. Further, droplets can be prevented from entering the gas supply pipe 57.

Figure 7:
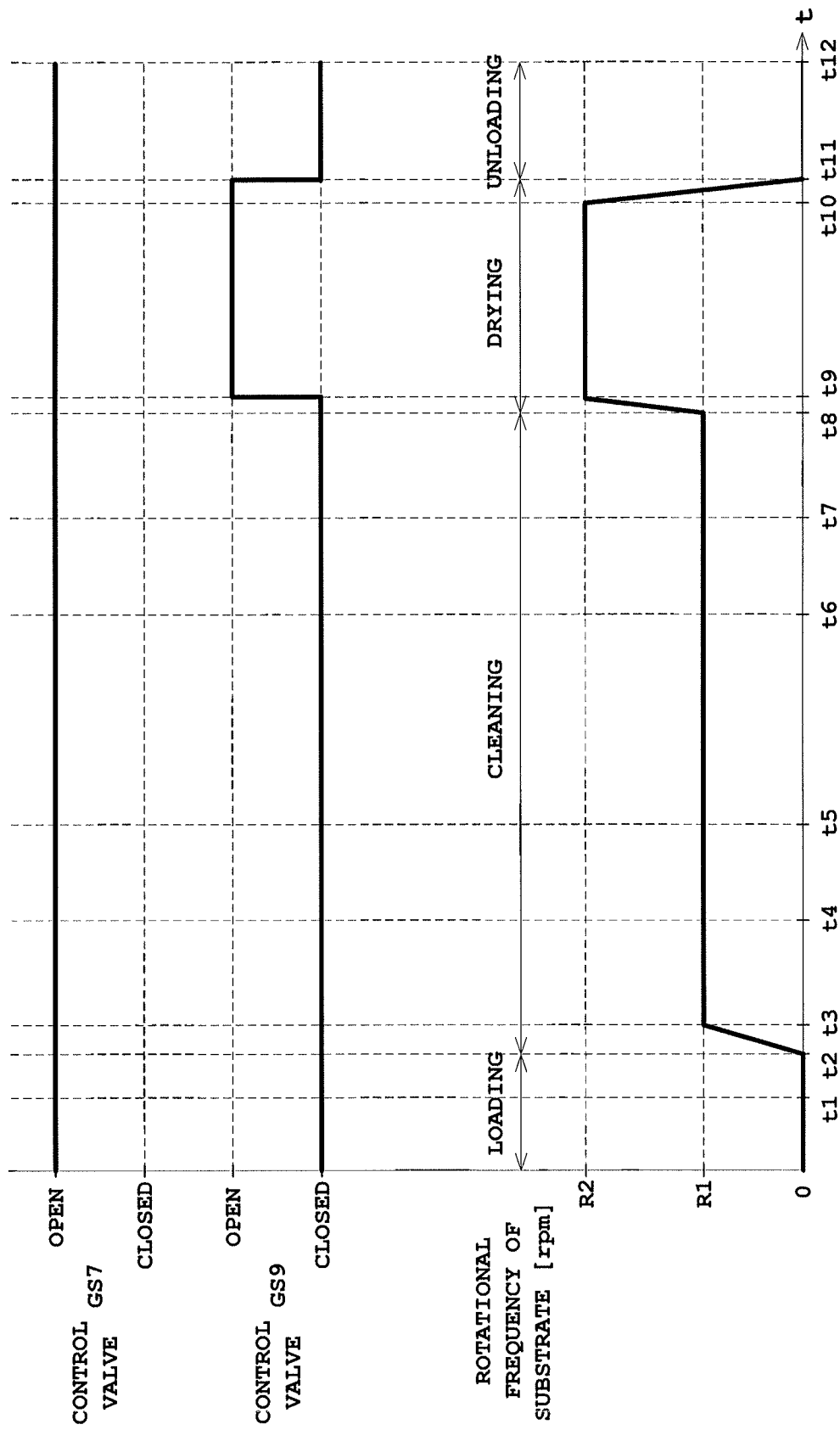
FIG. 7 is a time chart showing an example of operation of the substrate treating apparatus according to the embodiment.

Next, an example of treatment by the above substrate treating apparatus will be described with reference to FIG. 7. FIG. 7 is a time chart showing an example of operation of the substrate treating apparatus according to the embodiment. To facilitate understanding of the invention, the rinsing treatment of the upper surface of the wafer W after the cleaning treatment will be omitted from the following description.

At a point of time t=0, as shown in FIG. 1, the controller 111 has operated the cup lift mechanism CM to lower the scatter preventive cup 5 to the lower position. After withdrawal of the transport arm TA, the controller 111 operates the cup lift mechanism CM to raise the scatter preventive cup 5 to the upper position. The controller 111 controls loading of the wafer W to be finished by time t2. As noted hereinbefore, the controller 111 constantly keeps the control valve GS7 open to supply the nitrogen gas at the minimal flow rate from the gas-liquid nozzle 67.

At time t2, the electric motor 19 is operated to start rotation, which reaches rotational frequency R1 (e.g. 500 rpm) at time t3 for the cleaning treatment. Starting at time t3, the controller 111 operates the arm drive mechanism AM to swing the brush 107 radially on the upper surface of the wafer W, while supplying the APM from the treating liquid nozzle TS2 and supplying deionized water from the rinsing liquid supply pipe 58 to the lower surface of the wafer W. This operation is repeated throughout the cleaning treatment until time t8. Consequently, the cleaning treatment is given to the upper surface of the wafer W, with the lower surface of the wafer W covered and protected by the deionized water, The time period t2 to t8 corresponds to the "upper surface treating step" in this invention.

Next, the controller 111 carries out the drying treatment of the wafer W. Specifically, at time t8, the electric motor 19 is operated to raise the rotational frequency to reach rotational frequency R2 (e.g. 2000 rmp) at time t9 for the drying treatment. This rotational frequency R2 is maintained until time t10 to dispel by centrifugal force the rinsing liquid and any other substances adhering to the wafer W. Then, the controller 111 begins to slow down the rotation of the electric motor 19 at time t10 so that the rotational frequency will become zero at time t11. During this process, the controller 111 opens the control valve GS9 at time t9 when the rotational frequency has reached R2. Consequently, during the drying treatment, the nitrogen gas from the gas-liquid nozzle 67 increases to a high flow rate with the first flow rate and second flow rate added together. The controller 111 closes the control valve GS9 when the rotational frequency becomes zero, to supply the nitrogen gas at the first flow rate from the gas-liquid nozzle 67.

The above time period t8 to t11 corresponds to the "drying step" in this invention.

According to this embodiment, the controller 111, at the time of cleaning treatment with the brush 107, causes the APM to be supplied to the wafer W spinning at rotational frequency R1, and operates the control valve GS7 to supply the nitrogen gas at the first flow rate from the gas-liquid nozzle 67 to the lower surface of the wafer W. Then, after completion of the cleaning treatment, at the time of drying treatment in which the wafer W is spun at rotational frequency R2, the controller 111 operates the control valve GS9 to supply the gas at a higher flow rate than the first flow rate from the gas-liquid nozzle 67. At the time of drying treatment, the controller 111 only operates the control valve GS9 without operating a mass flow controller having poor response. This can improve response of flow rate switching of the nitrogen gas. Consequently, the drying time can be shortened, and treatment can be done with a high degree of cleanliness of the lower surface of the wafer W.

Figure 8:
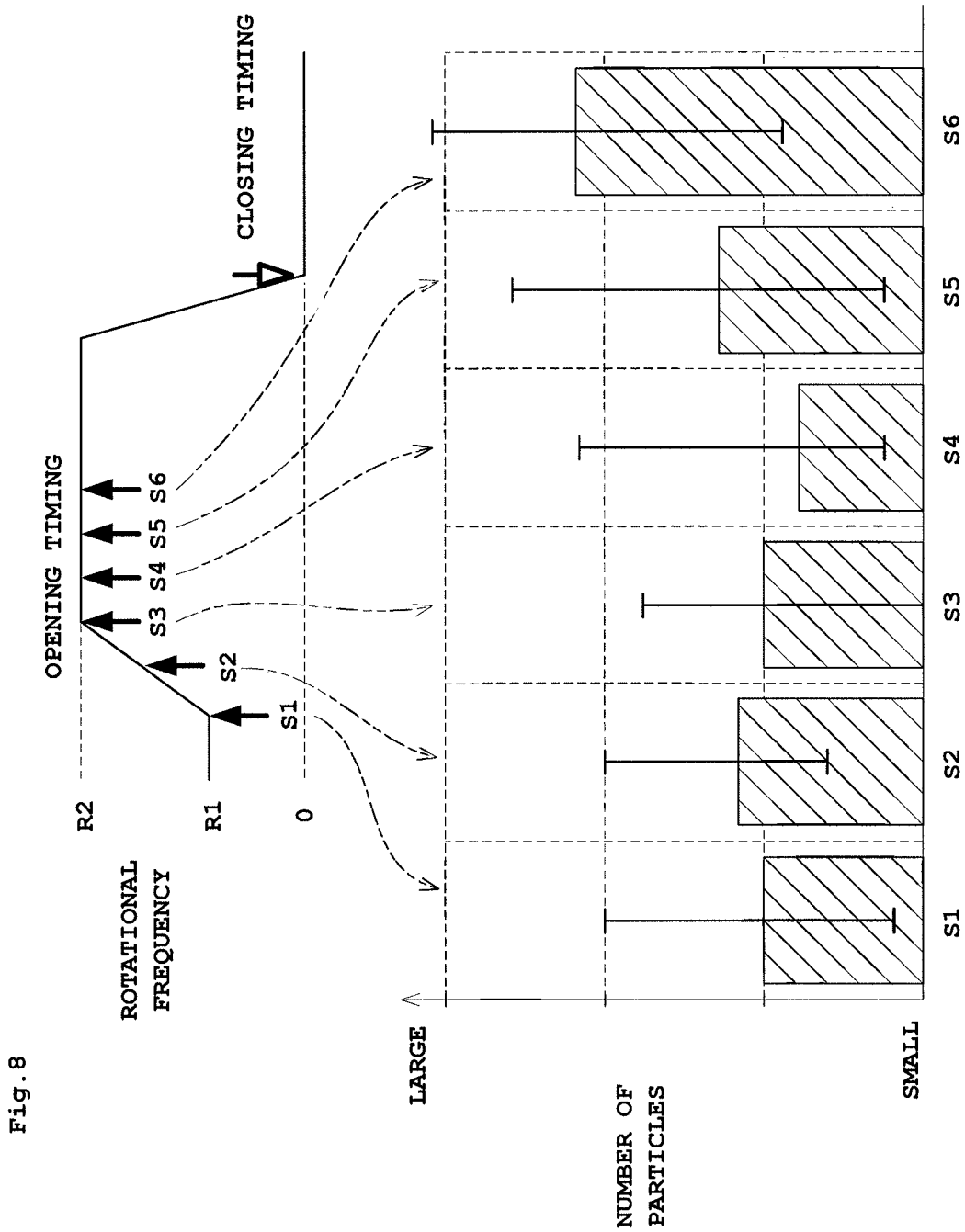
FIG. 8 is an explanatory graph of a relationship between timing of flow rate switching and degree of cleanliness.

Here, results of an experiment done on preferred timing of increasing the flow rate of nitrogen gas will be described with reference to FIG. 8. FIG. 8 is an explanatory graph of a relationship between timing of flow rate switching and degree of cleanliness. In this experiment, rotational frequency R1 is set to 1000 rpm, and rotational frequency R2 to 2400 rpm. In the graph, the bars represent average values, and the vertical lines with short horizontal lines represent minimum and maximum values.

For sample S1, the control valve GS9 is opened at a point of time when the increase from rotational frequency R1 to rotational frequency R2 is started. For sample S2, the control valve GS9 is opened when the middle rotational frequency (1700 rpm) between rotational frequency R1 and rotational frequency R2 is reached. For sample S3, the control valve GS9 is opened when rotational frequency R2 is reached as in the foregoing embodiment. Samples S4-S6 represent the cases where the timing of opening the control valve GS9 is delayed in successive stages after rotational frequency R2 is reached. The timing of closing the control valve GS9 is a point of time when the rotational frequency becomes zero, and which is the same for all samples.

From the maximum of the detected number of particles, it will be seen that what is preferable as timing of opening the control valve GS9 for the high flow rate is indicated by sample S3 which is the same timing as in the foregoing embodiment. The tendency of the maximum of the detected number of particles to increase with the delay from sample S3 is considered due to particles drawn toward the spin center at negative pressure. From these results it will be appreciated that an optimal timing of switching the flow rate is from the point of time when the increase from rotational frequency R1 to rotational frequency R2 is started to the point of time when rotational frequency R2 is reached.

Next, a relationship between the gas-liquid nozzle 67 and degree of cleanliness will be described with reference to FIG. 9. FIG. 9 is an explanatory graph of a relationship between direction of gas supply from the gas-liquid nozzle and degree of cleanliness.

This example of experiment shows degrees of cleanliness in the case of jetting the nitrogen gas horizontally as does the gas-liquid nozzle 67 in the foregoing embodiment, and in the case of jetting it up toward the lower surface of the wafer W. Recipes specifying treatment conditions for the cleaning treatment and drying treatment are made different from one another in the flow rate of the nitrogen gas.

The results show that, with any one of Recipes 1-3 specifying different flow rates of the nitrogen gas, the construction for horizontally jetting the nitrogen gas as does the gas-liquid nozzle 67 described above can perform treatment with high degrees of cleanliness. That is, considering the degree of cleanliness, it is preferable for the gas-liquid nozzle 67 to supply the nitrogen gas from adjacent the spin center toward edges of the wafer W.

This invention is not limited to the foregoing embodiment, but may be modified as follows:

(1) In the foregoing embodiment, only the control valve GS9 is opened at the time of drying treatment. Where the second flow rate is higher than the first flow rate, the control valve GS7 may be closed after the control valve GS9 is opened. In this way also the flow rate can be made higher at the time of drying treatment than when the control valve GS7 is opened, and the same effect is thereby produced while holding down consumption of the nitrogen gas. Since the control valve GS7 is closed after the control valve GS9 is opened, there does not occur the inconvenience of droplets entering the gas supply pipe 57.

(2) In the foregoing embodiment, the control valve GS7 is constantly kept open. However, the control valve GS7 may be opened only when there is a possibility of droplets entering the gas supply pipe 57. Consequently, a minimal flow rate as it may be, consumption of the nitrogen gas can be held down by an amount corresponding thereto.

(3) In the foregoing embodiment, the control valve GS7 and GS9 are in the form of switch valves capable of adjusting flow rate. These valves may be replaced, for example, with a combination of a flow control valve only capable of adjusting flow rate and a switch valve only capable of opening and closing.

(4) In the foregoing embodiment, the support device is constructed of six support pins 15, but this invention is not limited to such construction. For example, seven or more support pins 15 may be used. Further, the two movable support pins 27 are used to clamp the wafer W. Instead, three or more movable support pins 27 may be provided to clamp the wafer W.

(5) The foregoing embodiment shows APM as treating liquid, but this invention is not limited to this. Other treating liquids include, for example, deionized water (DIW), carbonated water, hydrogenated water, ammonia water ($NH_4OH$), SC-1, aqueous solution of citric acid, FOM (mixed chemical of hydrofluoric acid/ozone), FPM (mixed chemical of hydrofluoric acid/hydrogen peroxide solution/deionized water), HF, SC-2, HCl, IPA (isopropyl alcohol), TMAH (tetramethyl ammonium hydroxide), and aqueous solution of trimethyl-2-hydroxyethyl ammonium hydroxide (CHOLINE). Although nitrogen gas is used as inert gas, this invention is not limited to this, For example, helium (He), argon (Ar), and forming gas ($N_2+H_2$) are available. Although not an inert gas, air is also available as the gas supplied by the gas supply device.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating method for treating an upper surface of a substrate in a state where a lower surface of the substrate is covered with a treating liquid, comprising:
    providing a gas nozzle for supplying a gas to the lower surface of the substrate, first branch piping and second branch piping provided to connect to the gas nozzle, a first control valve for controlling circulation of the gas through the first branch piping to a first flow rate, and a second control valve for controlling circulation of the gas through the second branch piping to a second flow rate higher than the first flow rate,
    the method comprising the following steps executed in order: an upper surface treating step for treating the upper surface of the substrate by spinning a turntable at a first rotational frequency, with the turntable contacting and supporting edge regions of the substrate to have the lower surface of the substrate spaced from the turntable, and operating the first control valve to supply the gas at the first flow rate from the gas nozzle located centrally of the turntable to the lower surface of the substrate, in a state where the lower surface of the substrate is covered with the treating liquid; and
    a drying step for spinning the turntable at a second rotational frequency higher than the first rotational frequency, and operating the second control valve to supply the gas at a higher flow rate than the first flow rate from the gas nozzle, by adding the second flow rate to the first flow rate,
    wherein
    the first control valve and the second control valve are each continuously adjustable to desired flow rates, and
    the first control valve is kept constantly open, in the upper surface treating step and the drying step.

2. The substrate treating method according to claim 1, wherein in the drying step, when operating the first control valve and the second control valve, the second control valve is opened while keeping the first control valve open.

3. The substrate treating method according to claim 1, wherein in the drying step, the gas is supplied from the gas nozzle at least at the second flow rate during a period from a point of time of starting to increase rotational frequency from the first rotational frequency to the second rotational frequency to a point of time of reaching the second rotational frequency.

4. The substrate treating method according to claim 2, wherein in the drying step, the gas is supplied at least at the second flow rate during a period from a point of time of starting to increase rotational frequency from the first rotational frequency to the second rotational frequency to a point of time of reaching the second rotational frequency.

5. The substrate treating method according to claim 1, wherein the gas nozzle is configured to supply the gas radially toward the edge regions of the substrate in plan view.

6. The substrate treating method according to claim 1, wherein the gas nozzle has an opening height of at least 2 mm for supplying the gas.

* * * * *